United States Patent [19]

Hadwin

[11] Patent Number: 5,151,775
[45] Date of Patent: Sep. 29, 1992

[54] INTEGRATED CIRCUIT DEVICE HAVING IMPROVED SUBSTRATE CAPACITANCE ISOLATION

[75] Inventor: Matthew J. Hadwin, Beaverton, Oreg.

[73] Assignee: Tektronix, Inc., Wilsonville, Oreg.

[21] Appl. No.: 772,753

[22] Filed: Oct. 7, 1991

[51] Int. Cl.⁵ .................. H01L 39/02; H01L 23/48; H01L 27/02
[52] U.S. Cl. ...................... 357/80; 357/68; 357/51
[58] Field of Search ................ 357/80, 68, 51, 34

[56] References Cited
U.S. PATENT DOCUMENTS 4,646,002  2/1987  Tuszyski ............... 330/156

Primary Examiner—Mark V. Prenty
Attorney, Agent, or Firm—William K. Bucher

[57] ABSTRACT

An integrated circuit device having improved substrate capacitance isolation for use in a ultra low capacitance probe or an input to an oscilloseope or the like has an electrically conductive layer formed directly underneath an input node on the integrated circuit. The electrically conductive layer has a geometry substantially equal to the input node and is driven by a voltage output from a high impedance unity gain circuit. In one embodiment, the electrically conductive layer is formed in the first metal layer of the integrated circuit while an alternate embodiment an emitter region of a semiconductor device in the high impedance circuit is used as the electrically conductive layer.

7 Claims, 1 Drawing Sheet

INTEGRATED CIRCUIT DEVICE HAVING IMPROVED SUBSTRATE CAPACITANCE ISOLATION

BACKGROUND OF THE INVENTION

The present invention related to integrated circuits. More particularly the invention relates to an integrated circuit having improved substrate capacitance isolation at input nodes of the integrated circuit.

Integrated circuits, IC, are generally formed on an insulative substrate, such as silicon, gallium arsenide, or the like. The bottom surface of the substrate has a metal layer deposited on it by vapor deposition. The opposite surface has active and passive circuitry, such as transistors, diodes, resistors and capacitors, formed on it using well known IC processing techniques. Alternating layers of silicon dioxide and metal are deposited over the active circuitry and are etched to form bonding pads, trace runs and interconnects. The IC, containing the electrical circuitry, is placed in a package device or upon a substrate having leads, legs, or runs extending therefrom for electrically connecting the IC to external electrical circuitry. Electrical connections between bonding pads on the IC and the legs of the package device or the runs on the substrate are made via wire bonds.

Parasitic or substrate capacitance exists between the metal layers on the opposing surfaces of the substrate. Generally this capacitance is in the range of 0.15 picofarads. When in the presence of A. C. grounds, this capacitance has the effect of reducing the impedance of an input amplifier on the IC. The bottom metal layer of IC's are connected to A. C. ground, which is generally set at the lowest electrical potential applied to the device. For example, if the IC has applied electrical potentials of ±5 volts and ±15 volts, the metal layer is connected to the −15 volts. For a high impedance amplifier IC being used as an active probe or an input amplifier in a test instrument, such as an oscilloscope, logic analyzer, or the like, it is important to keep A. C. grounds away from the first input stage to reduce the input capacitance as much as possible. This is especially true if the amplifier input is being driven by a voltage divider attenuator circuit. Besides the parasitic capacitance there is also distributed resistance in the substrate that is effectively in series with the substrate capacitance. This series capacitive/resistive network is in parallel with the lower leg of the attenuator. The upper leg of the attenuator requires corresponding compensation to offset the parasitic capacitance and distributed series resistance developed in the IC. It is very difficult to compensate the upper leg for this distributed series resistance. Once an electrical signal enters the amplifier and is behind the first stage, the impedance is much lower and the substrate capacitive/resistive network and A. C. grounds are less critical.

U.S. Pat. No. 4,646,002 to Tuszyski describes a bootstrapping scheme for driving the bottom metal surface of the substrate with the output of the IC circuitry to reduce base-to-substrate capacitance. The device is characterized as a high impedance buffer circuit for use in a high impedance broad band probe. The circuit is formed on an the IC substrate having a metal layer on the bottom surface. The IC substrate is supported by a second substrate having its own metal layer. The metal layer of the IC substrate is driven by the output of the circuitry on the IC device. The metal layer on the supporting substrate is connected to A.C. ground. The intent of this design is to reduce the base-to-substrate capacitance of the transistor formed on the original substrate. However, there are drawbacks to this type of design. The geometry of the bottom metal layer covers the complete surface of the substrate requiring the buffer circuit to drive the total substrate capacitance of the IC. In addition, the further the metallized layer is from the active devices the more difficult it is to design an amplifier for driving the substrate at high frequencies. Additionally, it would be difficult to control feedback to areas not needing capacitive isolation.

What is needed is an improved IC design for isolating substrate capacitance in integrated circuit devices that overcomes the short comings of previous designs. The IC can be used as a high impedance input to an ultra low capacitance test probe or an input stage to electrical test equipment.

SUMMARY OF THE INVENTION

Accordingly, the present invention is an integrated circuit, IC, having improved substrate capacitance isolation wherein the IC has a substrate with an input node connected to a high impedance circuit on one surface and a metal layer on the opposite surface. An electrically conductive layer having a geometry substantially equal to the input node is disposed between the node and the metal layer with the electrically conductive layer being immediately underneath and insulated from the node by an insulating layer. The electrically conductive layer is driven by the output of the high impedance circuit.

In a first embodiment of the invention, the input node is a bond pad and trace run to the high impedance circuit and the electrically conductive layer is metal layer. In an alternative embodiment, the electrically conductive layer is an emitter region of a semiconductor device in the high impedance circuit. The highly doped emitter region has sufficiently high doping to maintain a low ohmic or equipotential surface. The objects, advantages and novel features of the present invention are apparent from the following detailed description when read in conjunction with appended claims and attached drawings.

DETAILED DESCRIPTION OF THE PREFERRED EMBODIMENT

Figure 1:
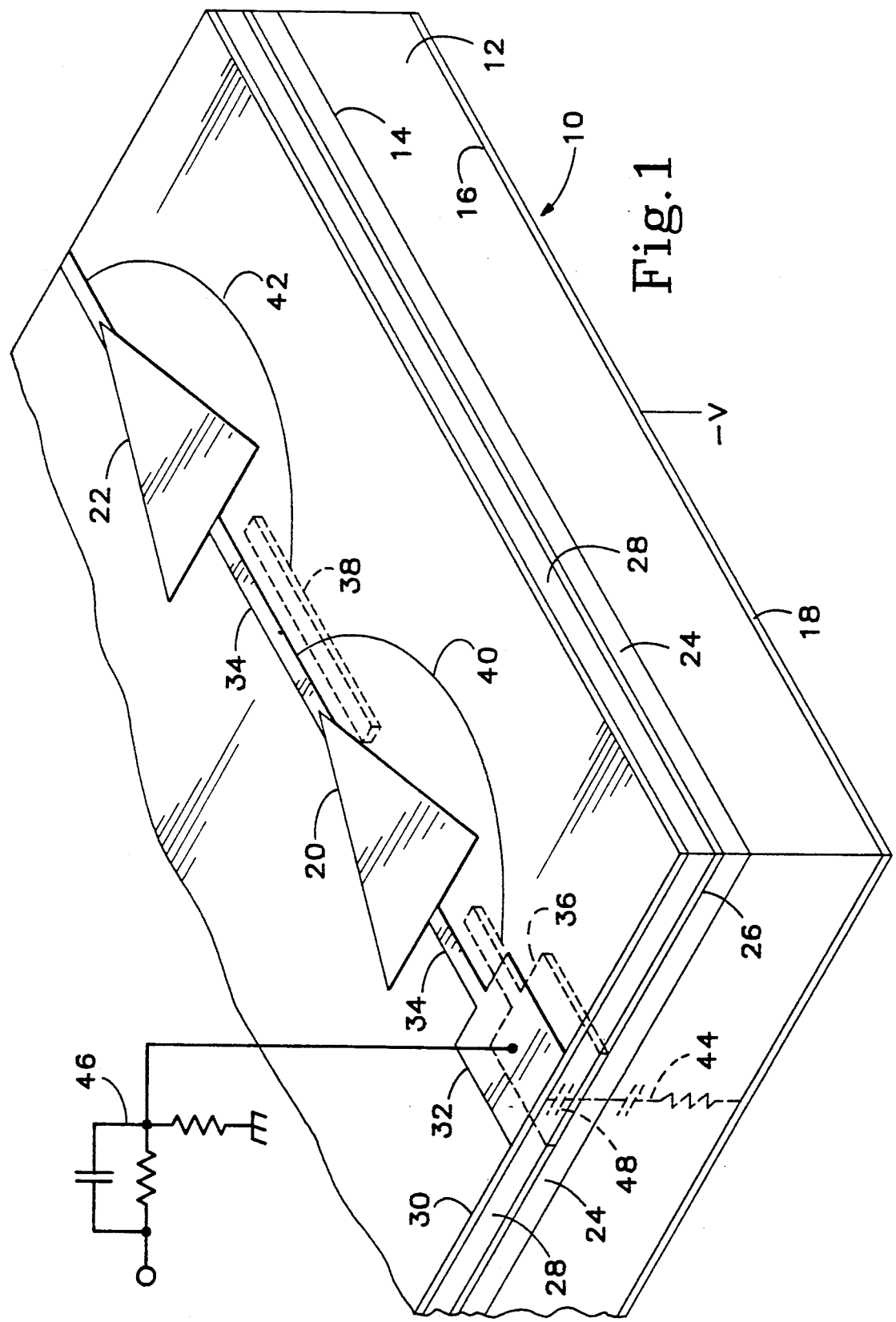
FIG. 1 is a representative drawing showing the improved integrated circuit for isolating substrate capacitance according to the present invention.

The improved integrated circuit, IC, 10 for isolating substrate capacitance is representatively shown in perspective view of FIG. 1. The integrated circuit 10 is formed from a silicon wafer, not shown, or similar type material and has a substrate 12 with top and bottom surfaces 14 and 16. The bottom surface 16 has a deposited metal layer 18 and the top surface 14 has electrical components formed thereon representatively shown by the operational amplifier symbols 20 and 22. The electrical components may contain both active and passive circuitry, such as transistors, diodes, resistors and capacitors, and are formed using well known IC processing techniques. Overlying the circuitry on the top surface is a first insulating layer of silicon dioxide 24, which is selectively etched to expose the underlying circuitry.

Overlying the first silicon dioxide layer 24 is a first metal layer 26, a second silicon dioxide layer 28, and a second metal layer 30. The metal layers 26 and 30 and the second silicon dioxide layer 28 are selectively etched to form bond pads 32, trace runs 34, and vias (not shown) for interconnecting the various circuits on the substrate. For the sake of clarity and understanding the invention, FIG. 1 does not show a full three dimensional perspective view of all of the various layers, components and interconnections on the integrated circuit. In addition, the terms first and second silicon dioxide layer and first and second metal layers are well known in the integrated circuit design and processing art and those having ordinary skill in these arts should have no difficulty in interpreting FIG. 1 and implementing the invention.

An input node to operational amplifier 20 is shown as bonding pad 32 and trace run 34 and an input node to operational amplifier 22 is shown as trace run 34. It is the practice in IC processing to form bonding pads using both the first and second metal layers 26 and 30 by selectively removing the second silicon dioxide layer 28 at the bonding pad 32 location. In the present invention, the second silicon dioxide layer 28 is not etched away. This provides an insulated electrically conductive layer formed in the first metal layer 26 directly underneath the second metal layer 30. This is shown in the FIG. 1 as the electrically conductive layers 36 and 38 lying directly underneath the bonding pad 32 and the trace runs 34. The electrically conductive layers 36 and 38 have geometries substantially the same as the bonding pad 32 and trace runs 34 and are electrically insulated from the input nodes by the silicon dioxide insulating layer 28. The electrically conductive layers 36 and 38 are shown being driven by the outputs of the respective operational amplifiers 20 and 22 via feedback lines 40 and 42. Alternately, the input node to amplifier 20 may be driven by the output of amplifier 22. Further, the output voltage of any amplifier on the IC may be fed back to drive an electrically conductive layer under an input node provided the amplifier output voltage amplitude is less than or equal to the amplitude of voltage on the input node.

Parasitic capacitance and distributed series resistance 44 exists between the metal layer 18 on the bottom surface 16 of the IC 10 and the first and second metal layers 26 and 30 on the top surface 14. In the presence of A. C. grounds, which are generated by connecting the metal layer 18 to the lowest voltage potential $-V$ applied to the IC, the series capacitive/resistive network lowers the input impedance of amplifier 20. Creating a second capacitance between the bonding pad 32 and trace runs 34 and the electrically conductive layer 36 and driving this capacitance with the output of amplifier 20 isolates the series capacitive/resistive network 44 from the input of amplifier 20. This effectively increases the input impedance of the amplifier 20.

Operational amplifier 20 is a high impedance unity gain voltage amplifier that is shown in FIG. 1 being driven by an external signal from a voltage divider attenuator network 46. The output voltage of amplifier 20 drives the electrically conductive layer 36 formed in the first layer metal 26. The voltage on the electrically conductive layer 36 changes as a function of the changes in the externally applied voltage signal. The amount of charge on input node capacitor 48 is directly proportional to the voltage potential between the plates of the capacitor times the capacitance as shown by the equation:

$$\Delta Q = C \times \Delta V$$

The voltage potential difference V on the input node capacitor 48 may be reduced to zero by driving the input node capacitance with a voltage that is equal in magnitude to the input signal voltage. This voltage is provided by amplifier 20. Since amplifier 20 is providing the charge Q to the capacitor 48, the charge Q supplied by the external input signal is zero which in effect reduces the input capacitance to zero as seen by the external signal source. Reducing the input capacitance has the effect of increasing the input impedance of the circuit.

Using the first and second layer metals 26 and 30 respectively for the electrically conductive layer 36 and the input node bonding pad 32 and trace run 34 produces a capacitance in the femtofarad range compared to a capacitance in the picofarad range between the bonding pad 32/trace run 34 and the bottom metal layer of the IC. Reducing the input node capacitance C without changing the magnitude of the input voltage reduces the charge Q on the capacitor 48. The charge Q on a capacitor is also directly proportional to the current times the time as shown by the equation:

$$\Delta Q = I \times \Delta t$$

Since Q is reduced as a function of the capacitance C of the capacitor 48 and the magnitude of the input voltage is constant, the time required to charge the input node capacitance is reduced. Since frequency is inversely proportional to time, reducing the time it takes to charge and discharge the input node capacitance increases the frequency at which the input amplifier can drive the input node. Forming an electrically conductive layer 36 in the first metal layer 26 having a geometry substantially equal to the bonding pad 32 and trace run 34 and driving the layer 36 with the output voltage of the input node amplifier, overcomes the disadvantages of the prior art. The charge Q into the input node capacitor 48 is reduced as compared to driving the total substrate capacitance 44 of the IC which makes it easier to design an amplifier for driving the input node capacitance at high frequencies. In addition, since the bottom metal layer 18 is not being driven as in the prior art, the problem of controlling feedback to areas not needing capacitive isolation is overcome.

The electrically conductive layer 36 disposed between the input node and the bottom metal layer 18 of the substrate 10 does not need to be a super low resistive layer. The layer 36 may be a higher resistive layer as long as the resistance is low enough for the charges to flow into and out of the capacitor. MOS and high performance bi-polar IC processes use polysilicon for resistors and conductors including the emitter and base regions of the semiconductor devices on the IC. In a further embodiment of the present invention, the electrically conductive layer 36 may be an emitter region of a semiconductor device in the high impedance circuit. The highly doped emitter region has sufficiently high doping to maintain a low ohmic or equipotential surface.

An integrated circuit device having improved substrate capacitance isolation has been described wherein input nodes of the IC are isolated from the substrate capacitance by forming a second capacitance at the input nodes and driving this capacitance with a voltage having the same magnitude as the input voltage. In one embodiment of the invention, the input node capacitance is formed in the first and second metal layers of the IC. The input node is formed in the second metal layer and an electrically conductive layer having a geometry substantially the same as the input node is formed in the first metal layer. The electrically conductive layer is driven by a high impedance unity gain amplifier. In an alternate embodiment, the electrically conductive layer is an emitter region of a semiconductor device in the high impedance unity gain amplifier. These and other aspects of the present invention are set forth in the appended claims.

I claim:

1. An integrated circuit having improved substrate capacitance isolation wherein the integrated circuit has a substrate with a metal layer formed on one surface thereof and a high impedance circuit with an input node formed on an opposite surface with the input node coupling an electrical signal to the high impedance circuit, the improvement comprising an electrically conductive layer having a geometry substantially equal to the input node and being disposed between the input node and the metal layer on the substrate with the electrically conductive layer being immediately underneath and insulated from the input node by an insulating layer with the electrically conductive layer being driven by the output of the high impedance circuit.

2. The integrated circuit as recited in claim 1 wherein the input node comprises a bond pad and a trace run.

3. The integrated circuit as recited in claim 1 wherein the electrically conductive layer is a metal layer.

4. An integrated circuit having improved substrate capacitance isolation wherein the integrated circuit has a substrate with a metal layer formed on one surface thereof comprising:

a input node formed on the opposite surface of the substrate for receiving an electrical signal;

a high impedance circuit formed on the same surface as the input node for receiving the electrical signal from the input node; and a electrically conductive layer having a geometry substantially equal to the input node and being disposed between the input node and the metal layer of the substrate with the electrically conductive layer being immediately underneath and insulated from the input node by an insulating layer with the electrically conductive layer being driven by the output of the high impedance circuit.

5. The integrated circuit as recited in claim 4 wherein the input node comprises a bond pad and a trace run.

6. The integrated circuit as recited in claim 4 wherein the electrically conductive layer is a metal layer.

7. A method of isolating substrate capacitance in an integrated circuit having a substrate with a metal layer formed on one surface thereof that is at an A. C. ground potential and a high impedance circuit formed on the opposite surface, the steps comprising:

applying an electrical signal to an input node of the high impedance circuit; and coupling the electrical signal output from the high impedance circuit to an electrically conductive layer having a geometry substantially equal to the input node and being disposed between the input node and the metal layer of the substrate with the electrically conductive layer immediately underneath and insulated from the input node by an insulating layer.

* * * * *